United States Patent
Hien et al.

(10) Patent No.: US 12,327,803 B2
(45) Date of Patent: Jun. 10, 2025

(54) OPTOELECTRONIC SEMICONDUCTOR COMPONENT AND ARRANGEMENT

(71) Applicant: OSRAM Opto Semiconductors GmbH, Regensburg (DE)

(72) Inventors: Matthias Hien, Kirchroth (DE); Matthias Goldbach, Pentling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 664 days.

(21) Appl. No.: 17/294,954

(22) PCT Filed: Nov. 7, 2019

(86) PCT No.: PCT/EP2019/080579
§ 371 (c)(1),
(2) Date: May 18, 2021

(87) PCT Pub. No.: WO2020/104207
PCT Pub. Date: May 28, 2020

(65) Prior Publication Data
US 2022/0020707 A1    Jan. 20, 2022

(30) Foreign Application Priority Data
Nov. 19, 2018   (DE) ............... 10 2018 129 003.9

(51) Int. Cl.
*H01L 23/64*   (2006.01)
*H01L 23/522*   (2006.01)
(Continued)

(52) U.S. Cl.
CPC ......... *H01L 23/645* (2013.01); *H01L 25/165* (2013.01); *H01L 25/167* (2013.01); *H10H 20/857* (2025.01); *H01L 23/5227* (2013.01)

(58) Field of Classification Search
CPC ..... H01L 23/5227; H01L 33/62; H01L 27/15; H01L 25/0753; H01L 25/0756;
(Continued)

(56) References Cited

U.S. PATENT DOCUMENTS 9,461,222 B1 * 10/2016 Wei .................... H01L 23/5227
9,723,699 B1 * 8/2017 Von Novak, III ...... H02J 50/12
(Continued)

FOREIGN PATENT DOCUMENTS

CN    101271916 A    9/2008
CN    101904219 A    12/2010
(Continued)

OTHER PUBLICATIONS

Office Action issued on Oct. 12, 2023 for corresponding Chinese Patent Application No. 201980074312.8, along with an English translation (18 pages).
(Continued)

Primary Examiner — Alia Sabur
(74) Attorney, Agent, or Firm — Hauptman Ham, LLP (57) ABSTRACT

An optoelectronic semiconductor component includes a semiconductor body having a main emission surface and an active region arranged to emit electromagnetic radiation. The optoelectronic semiconductor component also includes a receiving element arranged on the side of the semiconductor body opposite to the main emission surface. The optoelectronic semiconductor component also includes a radiation-transmissive molding compound. The radiation-transmissive molding compound completely surrounds the semiconductor body and the receiving element. A receiver frequency is assigned to the receiving element. The receiving element is configured to extract energy for operating the active region from an alternating electromagnetic field.

8 Claims, 5 Drawing Sheets

(51) Int. Cl.
  H01L 25/16 (2023.01)
  H10H 20/857 (2025.01)
(58) Field of Classification Search
  CPC ...... H02J 50/10; H02J 50/402; H05B 45/382; H05B 45/0037; H05B 45/19; H10H 20/857; H10H 20/851; H10H 29/851
  See application file for complete search history.

(56) References Cited

U.S. PATENT DOCUMENTS

| | | | | |
|---|---|---|---|---|
| 2012/0212150 | A1* | 8/2012 | Lakirovich | H05B 45/20 315/250 |
| 2015/0357315 | A1* | 12/2015 | Oraw | G09G 3/32 257/89 |
| 2018/0103516 | A1 | 4/2018 | Shun et al. | |

FOREIGN PATENT DOCUMENTS

| | | | |
|---|---|---|---|
| CN | 106328641 A | 1/2017 | |
| DE | 102015114010 A1 * | 3/2017 | ............ H01L 27/15 |
| EP | 2 225 915 A1 | 9/2010 | |
| JP | 2005-327845 A | 11/2005 | |
| WO | 2009/082566 A1 | 7/2009 | |

OTHER PUBLICATIONS

International Search Report issued for corresponding International Patent Application No. PCT/EP2019/080579 on Jan. 29, 2020, along with an English translation.

Written Opinion issued for corresponding International Patent Application No. PCT/EP2019/080579 on Jan. 29, 2020.

Thabet et al., "An Approach to Calculate the Efficiency for an N-Receiver Wireless Power Transfer System", International Journal of Advanced Computer Science and Applications (IJACSA), vol. 6, No. 9, 2015, pp. 91-98, cited in the Specification.

* cited by examiner

OPTOELECTRONIC SEMICONDUCTOR COMPONENT AND ARRANGEMENT

CROSS REFERENCE TO RELATED APPLICATION

This application is a National Stage of International Application No. PCT/EP2019/080579, filed on Nov. 7, 2019, which designates the United States and was published in Europe, and which claims priority to German Patent Application No. 10 2018 129 003.9, filed on Nov. 19, 2018, in the German Patent Office. Both of the aforementioned applications are hereby incorporated by reference in their entireties.

An optoelectronic semiconductor component and an arrangement comprising an optoelectronic semiconductor component are specified.

One task to be solved is to specify an optoelectronic semiconductor component that enables simplified contacting.

Another task to be solved is to specify an arrangement of an optoelectronic semiconductor component or a plurality of optoelectronic semiconductor components that enables simplified manufacturing.

The optoelectronic semiconductor component is in particular a radiation-emitting or a radiation-detecting optoelectronic semiconductor component which emits or detects electromagnetic radiation, for example light, during operation.

According to at least one embodiment of the optoelectronic semiconductor component, the optoelectronic semiconductor component comprises a semiconductor body having a main emission surface and an active region arranged to emit electromagnetic radiation. The active region preferably extends transversely, in particular perpendicularly, to a main radiation direction. The active region comprises a pn junction, a double heterostructure, preferably a single quantum well (SQW) or, particularly preferably, a multiple quantum well (MQW) structure for radiation generation. The semiconductor body is preferably epitaxially grown on a provided growth substrate.

The main emission surface preferably extends parallel to the active region and is provided to couple electromagnetic radiation out of the semiconductor body. A majority of the electromagnetic radiation generated in the active region during operation exits the semiconductor body through the main emission surface.

For example, the active region is configured to emit electromagnetic radiation for the spectral region perceptible in humans. Alternatively, the active region is configured to emit electromagnetic radiation in the infrared or ultraviolet spectral region.

According to at least one embodiment of the optoelectronic semiconductor component, the optoelectronic semiconductor component comprises a receiving element which is arranged on the side of the semiconductor body facing away from the main emission surface. The receiving element is configured to extract energy from an alternating electromagnetic field and to convert this energy at least partially into electrical energy. The receiving element may comprise a coil or an otherwise shaped antenna. In particular, the receiving element is fixedly connected to the semiconductor body. This may mean, for example, that the receiving element can only be detached from the receiving element and/or the semiconductor body by destroying the latter.

According to at least one embodiment of the optoelectronic semiconductor component, a receiver frequency is assigned to the receiving element. The receiver frequency corresponds to the resonant frequency of the receiving element. The resonant frequency results inter alia from the geometric dimensions of the receiving element or can be set, for example, by means of a coupled capacitance. The coupling of energy from an alternating electromagnetic field into the receiving element is advantageously particularly efficient at a frequency corresponding to the resonant frequency.

Operation at the receiver frequency thus establishes the optimum coupling factor between the alternating electromagnetic field and the receiving element. The coupling factor describes the efficiency with which energy is coupled into the receiving element from the alternating electromagnetic field. Factors influencing the coupling factor include, inter alia, the dimensions of the coils or antennas, the number of turns of the coil or the length of the antenna, the distance between the transmitter device and the receiving element, the geometry of the transmitter element, and the distance of the transmission frequency from the resonance frequency of the receiving element.

According to at least one embodiment, the optoelectronic semiconductor component comprises,
 a semiconductor body having a main emission surface and an active region arranged for emission of electromagnetic radiation, and
 a receiving element arranged on the side of the semiconductor body facing away from the main emission surface, wherein
 a receiver frequency is assigned to the receiving element, and
 the receiving element is configured to extract energy for operating the active region from an alternating electromagnetic field.

An optoelectronic semiconductor component described herein is based inter alia on the following considerations: The use of an optoelectronic semiconductor component which is exposed to environmental influences such as temperature fluctuations and fluctuations in humidity is often associated with high requirements. For example, it is advantageous to provide the optoelectronic semiconductor component with an encapsulation that can withstand the environmental influences. However, the electrical supply of the optoelectronic semiconductor component is usually provided by means of an electrical supply line. The electrical supply line, however, usually requires the encapsulation to be broken through at at least one point. This penetration can represent a point of attack for environmental influences. In the case of contacting via contact pads, encapsulation is facilitated, but consequently exact alignment of the contact pads to predetermined connection surfaces is necessary, which disadvantageously increases a manufacturing cost.

The optoelectronic semiconductor component described herein makes use, inter alia, of the idea of realizing the electrical contacting of the optoelectronic semiconductor component by means of inductive coupling. A receiving element extracts energy from an alternating electromagnetic field and converts it at least partially into electrical energy by means of which a semiconductor body can be supplied. The receiving element can be galvanically isolated from the transmitter element that generates the alternating electromagnetic field. Galvanic isolation is understood here and in the following to mean an avoidance of an electrical line between two circuits, here in particular the receiving element and the transmitter element, between which power or signals are to be exchanged. Thus, the optoelectronic semiconductor component can be completely encapsulated. Furthermore, this can also eliminate the need for precise adjustment of the optoelectronic semiconductor components, since the coupling of electrical energy from the alternating electromagnetic field does not require precise adjustment of the receiver element with respect to the transmitter element. This advantageously results in a kind of modular design principle, since all components—both optoelectronic semiconductor components and transmitter device—can be easily exchanged and encapsulated by themselves.

According to at least one embodiment of the optoelectronic semiconductor component, the receiving element comprises a coil with at least one turn. A coil with one turn may comprise a helical path or a circle in a plane. The coil may also be formed by other non-circular shapes, such as a polygon, for example, a quadrilateral. The coil is formed with an electrically conductive material, for example a metal wire. Alternatively, the coil may be directly deposited on the side of the semiconductor body facing away from the main emission surface by an electrodeposition process. Further, the coil may be separately fabricated and non-detachably bonded to the semiconductor body by, for example, an adhesive or bonding process. An insulation layer may be arranged between the turns of a coil for electrical insulation of different turns of the coil. The insulation layer is formed with an electrically insulating material, such as a polymer or a ceramic. Thus, the coil may be embedded in an electrically insulating material.

According to at least one embodiment of the optoelectronic semiconductor component, the coil comprises two or more turns, wherein each turn of the coil is arranged in a separate layer of the receiving element and the layers are arranged stacked on top of each other. A coil having two or more turns may comprise a helical configuration. In a direction parallel to the main extension axis of the coil, the coil may be circular in shape, for example. As the number of turns increases, the inductance of the coil also increases.

According to at least one embodiment of the optoelectronic semiconductor component, the coil comprises two or more turns, wherein the turns of the coil are arranged in a spiral or helical shape in a common layer of the receiving element. A spiral or helical arrangement enables a space-saving arrangement of multiple turns of a coil in a common plane.

According to at least one embodiment of the optoelectronic semiconductor component, the optoelectronic semiconductor component comprises a transparent molding compound that completely surrounds the semiconductor body and the receiving element. In particular, the transparent molding compound is formed with an epoxy resin or a silicone. For example, the molding compound is formed with the same material as the insulation layer of the coil of the receiving element. This improves adhesion between the molding compound and the receiving element. The molding compound can protect the semiconductor body and the receiving element from external environmental influences, such as moisture in particular, the influence of corrosive media and oxidation. In particular, the transparent molding compound is transparent to radiation, preferably transparent to electromagnetic radiation generated in the active region during operation of the optoelectronic semiconductor component.

An arrangement is further specified. In particular, the arrangement may include an optoelectronic semiconductor component described herein. That is, all features described for the optoelectronic semiconductor component are also disclosed for the arrangement, and vice versa.

According to at least one embodiment of the arrangement, the arrangement comprises at least two of the optoelectronic semiconductor components described herein and at least one transmitter device. The transmitter device is in particular galvanically isolated from the optoelectronic semiconductor component.

According to at least one embodiment of the arrangement, the transmitter device comprises at least one transmitter element and is configured to generate the alternating electromagnetic field. The transmitter element may be, in particular, a coil or an antenna of a different shape. The transmitter element is assigned a transmitter frequency in which an alternating electromagnetic field is generated by the transmitter element.

According to at least one embodiment of the arrangement, the receiver frequency of each receiving element is the same within the manufacturing tolerance. "Within the manufacturing tolerance" means here and in the following, for example, that the receiver frequency of the receiving elements deviates at most by +/−1% from an average value of the receiver frequency for all receiving elements. Advantageously, this results in a common resonant frequency for all receiving elements in which the receiving elements can be excited. In particular, the common resonant frequency can differ from the receiver frequency of the individual receivers. The document THABET, Thabat, 2015. *An Approach to Calculate the Efficiency for an N-Receiver Wireless Power Transfer System*. In: International Journal of Advanced Computer Science Applications. Vol. 6, No. 9, pp. 91-98, the disclosure content of which is hereby incorporated by reference, describes theoretical relationships, in the extraction of energy from an alternating electromagnetic field by one or more receiving elements. Advantageously, the extraction of energy from the alternating electromagnetic field is particularly efficient at the common resonant frequency. The common resonant frequency can be adjusted inter alia by the number of receiving elements, by the arrangement of the receiving elements and by the distances between the receiving elements.

According to at least one embodiment of the arrangement, at least some of the receiving elements comprise different receiver frequencies. For example, receiving elements of a same receiver frequency are combined in a common group. The receiver frequencies of different groups may differ from each other. Different receiver frequencies may be set, for example, by a different coil geometry or a different electrical circuitry of the individual receiving elements. The distance between the receiver frequency and the transmitter frequency determines, inter alia, the coupling factor between the receiving elements and the alternating electromagnetic field. A poor coupling factor reduces the coupling of electrical energy from the alternating field into the receiving element. By means of the frequency of the alternating electromagnetic field, an intensity of the light emitted by an optoelectronic semiconductor component, for example, can be set via the coupling factor.

According to at least one embodiment of the arrangement, the arrangement comprises a transmitter device having a plurality of transmitter elements each tuned to a receiver frequency of a receiving element or a group of receiving elements. Thus, at least one receiving element is associated with each transmitter element. By this assignment, each receiving element can be individually controlled. For example, groups of similar receiving elements that comprise the same receiver frequency can also be driven by a transmitter element.

According to at least one embodiment of the arrangement, each receiving element is assigned exactly one transmitter element that is tuned to the receiver frequency of the receiving element assigned to it. In other words, each transmitter element can comprise a different transmission frequency and can thus serve to drive a receiving element individually tuned to this receiving frequency. For example, the arrangement may form a display in which each optoelectronic semiconductor component is individually controllable.

According to at least one embodiment of the arrangement, the transmitter device comprises a single transmitter element and is configured to sequentially generate alternating electromagnetic fields of different transmission frequencies, each of which is tuned to the receiving frequencies of the receiving elements. When using a single transmitter element, the receiving elements are sequentially driven one after the other. For this purpose, the transmitter device is capable of transmitting alternating electromagnetic fields with different frequencies in a short time sequence one after the other. Thus, a plurality of receiving elements can advantageously be controlled by means of only one transmitter element.

According to at least one embodiment of the arrangement, different receiving elements of the arrangement that comprise different receiver frequencies are configured to emit electromagnetic radiation having a different color. A different color such as red, green, blue and/or yellow corresponds to a different wavelength of the electromagnetic radiation. In particular, a color is a color impression that can be perceived by the human eye, which is caused by the electromagnetic radiation reaching the human eye. In other words, a receiver frequency is thus associated with a single optoelectronic semiconductor component intended to emit a particular color or with a group of optoelectronic semiconductor components intended to emit a particular color. If the alternating electromagnetic field has a frequency which is thus assigned to a specific color, only the optoelectronic semiconductor components which comprise the suitably assigned receiver frequency become active. Thus, advantageously, an arrangement emitting in almost any color can be formed.

According to at least one embodiment of the arrangement, optoelectronic semiconductor components are arranged in a plurality of planes one above the other. Each plane comprises exclusively optoelectronic semiconductor components configured to emit electromagnetic radiation of the same color. Furthermore, the optoelectronic semiconductor components in different planes are configured to emit electromagnetic radiation of different colors. In particular, the main emission directions of all optoelectronic semiconductor components are aligned in parallel.

The use of inductive coupling enables simple contacting for this multilayer structure, since a via through the layers can be advantageously omitted. The multilayer structure makes it possible, for example, to produce a three-dimensional display whose optoelectronic semiconductor components or emitters can be arranged in the form of a cube. Since the coupling factor between the transmitter device and the receiving element decreases with increasing distance of a receiving element from the respective transmitter device, a correction of the brightness of the respective optoelectronic semiconductor component may be necessary.

This correction can be made by an artificially degraded coupling factor, for the optoelectronic semiconductor components whose distance to the transmitter device is smaller. In other words, optoelectronic semiconductor components whose distance to the transmitter device is smaller than the distance of optoelectronic semiconductor components from layers arranged above it are operated at a frequency that comprises a correspondingly larger distance from their receiver frequency in order to achieve a worse coupling factor. Furthermore, the degradation of the brightness of an optoelectronic semiconductor component can also be readjusted over its lifetime or over the course of the operating temperature by influencing the coupling factor via the choice of the transmitter frequency.

According to at least one embodiment of the arrangement, optoelectronic semiconductor components are arranged in a common plane and placed in groups in the plane, wherein the optoelectronic semiconductor components of a group are configured to emit light of different colors in pairs. For example, a group of optoelectronic semiconductor components includes optoelectronic semiconductor components configured to emit electromagnetic radiation of a red (R), a green (G) and a blue (B) radiation. Furthermore, such an RGB group may also comprise an additional optoelectronic semiconductor component arranged for the emission of white (W) light. Particularly advantageously, RGB or RGBW groups are suitable for displaying almost any color. By additive superposition of the primary colors, any desired color location can be achieved on a chromaticity scale, which is located within an area spanned by the color values of the individual emitters.

According to at least one embodiment of the arrangement, the optoelectronic semiconductor components are irregularly arranged in a plane. In particular, the alignment and the arrangement of optoelectronic semiconductor components configured to emit electromagnetic radiation of the same color do not follow any regular pattern. This advantageously eliminates the effort of exact alignment of the optoelectronic semiconductor components to, for example, previously predetermined contact pads. In the case of an irregular arrangement of optoelectronic semiconductor components emitting different colors, good color mixing can thus be achieved particularly easily and efficiently.

Further advantages and advantageous embodiments and further embodiments of the optoelectronic semiconductor component result from the following exemplary embodiments shown in connection with the figures.

Showing in.

Identical, similar or similarly acting elements are provided with the same reference signs in the figures. The figures and the proportions of the elements shown in the figures with respect to one another are not to be regarded as to scale. Rather, individual elements may be shown exaggeratedly large for better representability and/or for better comprehensibility.

Figure 1:
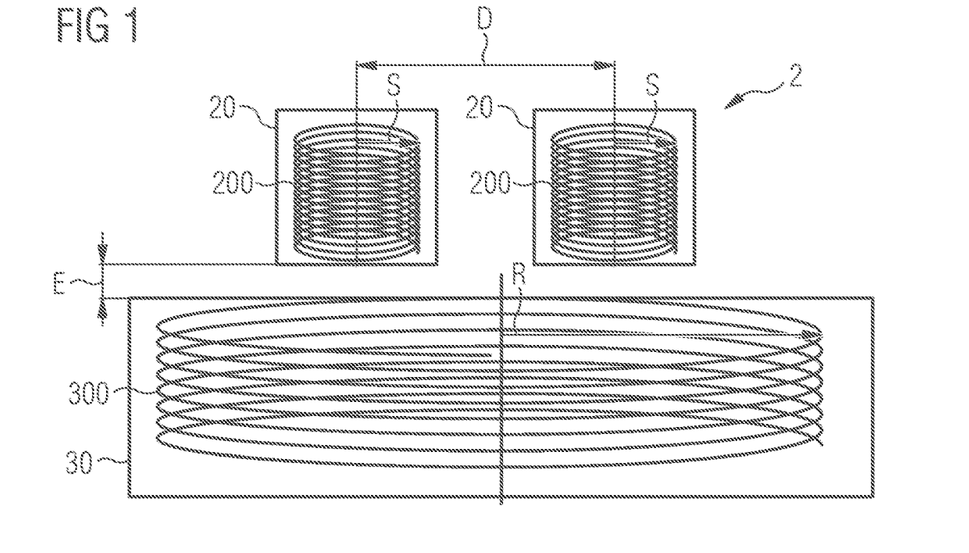
FIG. 1 a schematic view of an arrangement described herein.

FIG. 1 shows a schematic view of an arrangement 2 described herein. The arrangement 2 comprises a transmitter device 30 and two receiving elements 20. The transmitter device 30 comprises a transmitter element 300 which is controlled via a control device not shown here. The transmitter device 30 is configured to generate an alternating electromagnetic field. Each of the receiving elements 20 comprises a coil 200 configured to extract energy from the alternating electromagnetic field generated by the transmitter device 30 and to convert this energy at least partially into electrical energy. The receiving elements 20 are coupled to the transmitter device 30 by means of inductive coupling via a coupling factor. The transmitter element 300 comprises a radius R and the receiving elements 20 comprise a radius S different therefrom. The coupling factor is influenced inter alia by the coil geometry of the coil 200 and the transmitter element 300, as well as by the distance D of the coils 200 from each other and the distance E of the coils 200 from the transmitter element 300.

Each receiving element 20 is assigned a receiver frequency, which results inter alia from the resonant frequency of the coil 200. If an alternating electromagnetic field is generated by the transmitter device 30 with a transmitter frequency corresponding to the receiver frequency, the coupling factor is at a maximum. In the case of two or more receiving elements 20 within the alternating electromagnetic field of the transmitter device 30, a common receiver frequency may result which differs from the receiver frequency of each individual receiving element 20.

Figure 2A:
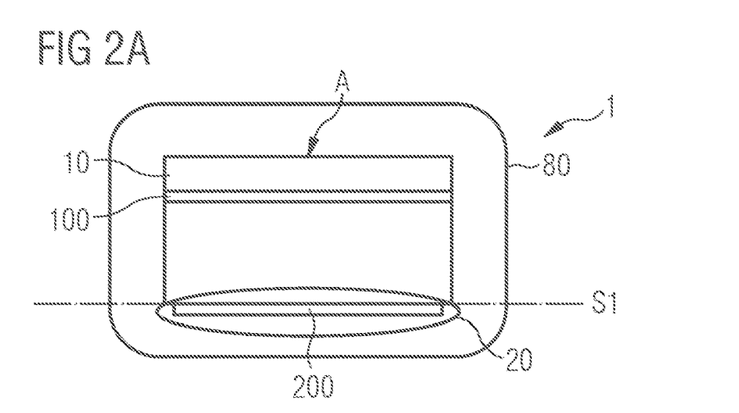
FIGS. 2A and 2B schematic cross-sections of an optoelectronic semiconductor component described herein according to a first exemplary embodiment, FIGS. 3A and 3B schematic cross-sections of an optoelectronic semiconductor component described herein according to a second exemplary embodiment, FIGS. 4A and 4B schematic cross-sections of an optoelectronic semiconductor component described herein according to a third exemplary embodiment, FIG. 5A a schematic top view of an arrangement described herein according to a first exemplary embodiment, FIG. 5B a schematic top view of an arrangement described herein according to a second exemplary embodiment, FIG. 5C a schematic top view of an arrangement described herein according to a third exemplary embodiment, FIG. 6 a schematic cross-section of an arrangement described herein according to a fourth exemplary embodiment, and FIG. 7 a schematic cross-sectional view of an arrangement described herein according to a fifth exemplary embodiment.

FIG. 2A shows a schematic cross-sectional view of an optoelectronic semiconductor component 1 described herein according to the first exemplary embodiment. The optoelectronic semiconductor component 1 includes a semiconductor body 10 in which an active region 100 configured to emit electromagnetic radiation is arranged. The semiconductor body 10 has a main emission surface A which is used to couple out a majority of the electromagnetic radiation generated in the active region 100 during operation. A receiving element 20 is arranged on the opposite side of the semiconductor body 10 from the main emission surface A. The receiving element 20 comprises a coil 200 which is electrically conductively connected to the semiconductor body 10. The coil 200 is configured to extract energy from an alternating electromagnetic field, to convert this energy at least partially into electrical energy and to make it available to the semiconductor body 10.

The semiconductor body 10 uses this electrical energy to energize the active region 100. The receiving element 20 and the semiconductor body 10 are completely encapsulated in a molding compound 80. The molding compound 80 protects the semiconductor body 10 and the receiving element 20 from external environmental influences, such as moisture, oxidation, and mechanical damage. The molding compound 80 is formed with a silicone or epoxy material. The molding compound 80 is transmissive to electromagnetic radiation generated in the active region 100 during operation and, in particular, is transparent.

Figure 2B:
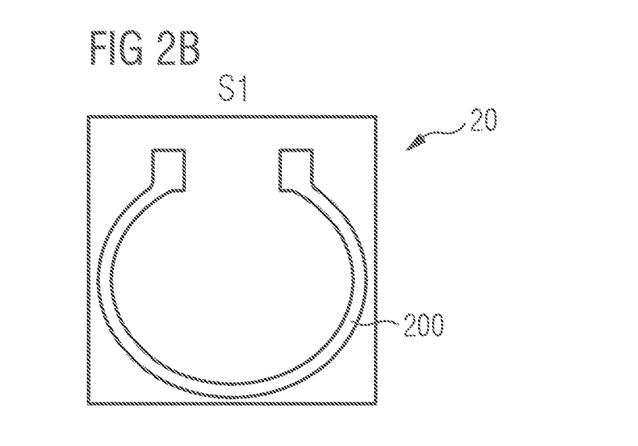

FIG. 2B shows a schematic cross-section of an optoelectronic semiconductor component 1 described herein according to the first exemplary embodiment. The schematic cross-sectional view shown in FIG. 2B corresponds to a cross-section through an optoelectronic semiconductor component 1 according to the exemplary embodiment shown in FIG. 2A in a section along the first layer S1. The illustrated first layer S1 shows the receiving element 20, which is formed with a coil 200. The coil 200 comprises a circular cross-section and is formed with an electrically conductive material. The coil 200 comprises one turn. An electrical contact pad is provided at each of the two ends of the coil 200, from which the electrical energy absorbed in the coil 200 can be extracted. By means of these contact pads, the semiconductor body 10 is electrically conductively connected to the coil 200.

Figure 3A:
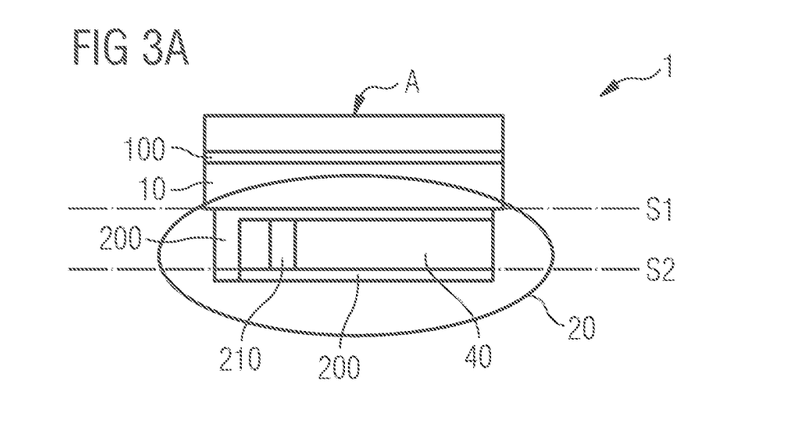

FIG. 3A shows a schematic cross-section of an optoelectronic semiconductor component 1 described herein according to the second exemplary embodiment. The optoelectronic semiconductor component 1 comprises a semiconductor body 10 having an active region 100 and a main emission surface A. A receiving element 20 is arranged on the side opposite the main emission surface A. The receiving element 20 comprises an arrangement of a plurality of turns of a coil 200 in two layers S1, S2. The first coil 200 is located in the first layer S1 and the second coil 200 is located in the second layer S2 below the first layer S1. An insulation layer 40 formed with an electrically insulating material is arranged between the layers S1 and S2. The first turn of the coil 200 in the first layer S1 is electrically conductively connected to the second turn of the coil 200 in the second layer S2 via a via 210 that completely penetrates the insulation layer 40. Alternatively, the coil 200 may comprise multiple turns in only one layer, for example, in that the coil 200 is spiral-shaped.

Figure 3B:
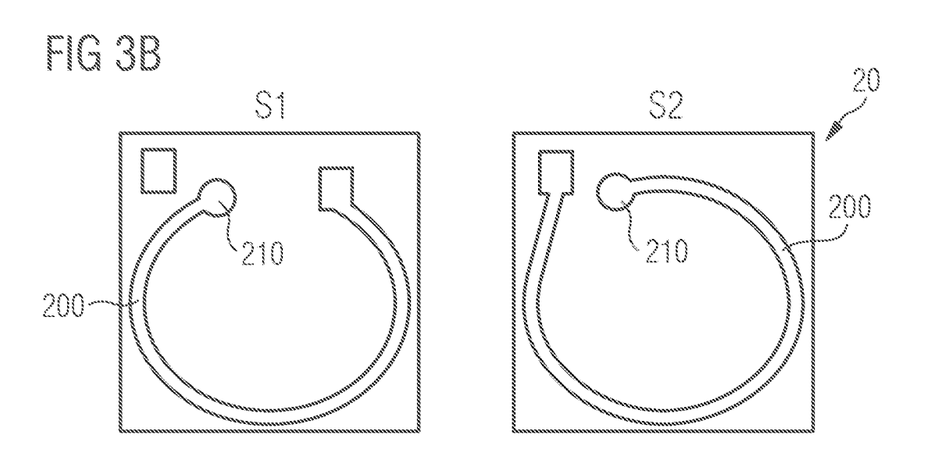

FIG. 3B shows a schematic cross-section of an optoelectronic semiconductor component 1 described herein according to the second exemplary embodiment. The schematic cross-sectional view shown in FIG. 3B corresponds to a cross-section through an optoelectronic semiconductor component 1 according to the exemplary embodiment shown in FIG. 3A in a section along the first layer S1 and the second layer S2. The first layer S1 comprises a coil 200 which comprises a turn. In the second layer S2, another turn of a coil 200 is shown. The layers S1 and S2 comprise a via 210 that electrically connects the individual turns. Via 210 allows easy fabrication of a coil 200 with two turns from two individual turns in the different layers S1 and S2.

Figure 4A:
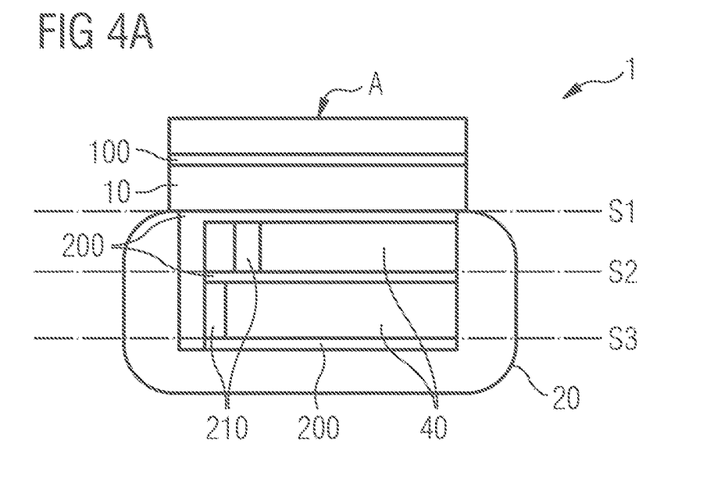

FIG. 4A shows a schematic cross-section of an optoelectronic semiconductor component 1 described herein according to the third exemplary embodiment. The optoelectronic semiconductor component 1 comprises a semiconductor body 10 having an active region 100 and a main emission surface A. On the side of the semiconductor body 10 facing away from the main emission surface A, there is arranged a receiving element 20 comprising a plurality of turns of a coil 200 in a plurality of layers S1, S2 and S3. In each of the layers S1, S2, S3, a coil 200 with one turn is arranged, which are electrically conductively connected to each other via two vias 210 and thus together form a coil 200 with three turns. The first layer S1 is electrically insulated from the second layer S2 by means of an insulation layer 40. The second layer S2 is electrically insulated from the third layer S3 by means of an insulation layer 40.

Figure 4B:
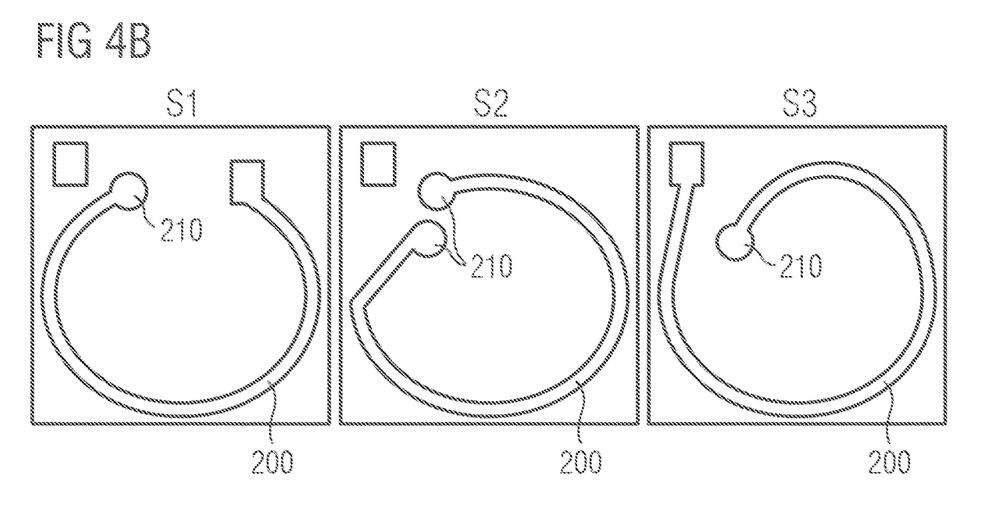

FIG. 4B shows a schematic cross-section of an optoelectronic semiconductor component 1 described herein according to the third exemplary embodiment. The schematic cross-sectional view shown in FIG. 4B corresponds to a cross-section through an optoelectronic semiconductor component 1 according to the exemplary embodiment shown in FIG. 4A in a section along the first layer S1, the second layer S2 and the third layer S3. In each layer S1, S2 and S3, a circular turn of a coil 200 is shown. All layers S1, S2, S3 are each electrically insulated from each other by means of an insulation layer 40 layer. The layers each comprise vias 210, which make it possible to produce a coil 200 with three turns.

Figure 5A:
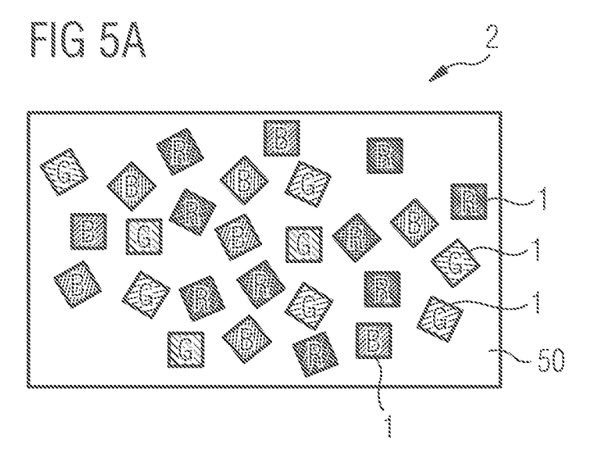

FIG. 5A shows a schematic top view of an arrangement 2 described herein according to the first exemplary embodiment. The arrangement 2 comprises a plurality of optoelectronic semiconductor components 1 configured to emit light of a different color. The optoelectronic semiconductor components 1 shown here are configured to emit red R, green G, and blue B light. The optoelectronic semiconductor components 1 are placed on a carrier 50 which comprises a mechanical stabilizing effect. The placement and orientation of the optoelectronic semiconductor components 1 are irregular. In other words, the optoelectronic semiconductor components 1 are not arranged and aligned according to a regular pattern. The optoelectronic semiconductor components 1 are energized by means of an alternating electromagnetic field. Alignment of the optoelectronic semiconductor components 1 with an electrical contact pad specified, for example, by the carrier 50 is thus advantageously omitted. This placement makes it possible to achieve particularly good mixing of the individual colors. Thus a particularly uniform white impression can be created for an observer.

Figure 5B:
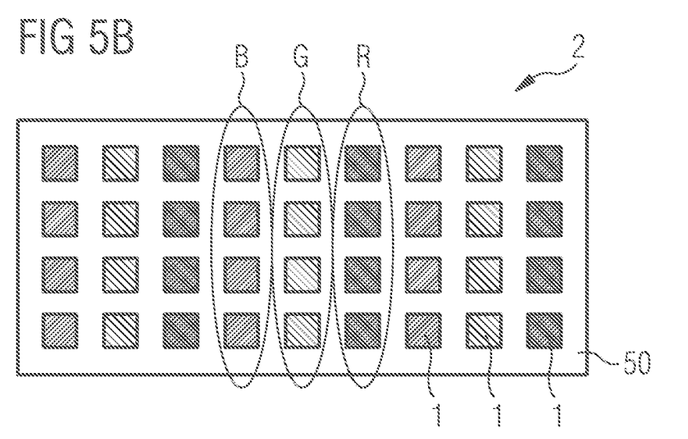

FIG. 5B shows a schematic top view of an arrangement 2 described here according to the second exemplary embodiment. The arrangement 2 comprises a carrier 50 on which a plurality of optoelectronic semiconductor components 1 are arranged. The optoelectronic semiconductor components 1 are arranged according to a regular pattern and sorted according to the color of electromagnetic radiation which they are configured to emit. In the region marked with B, there are only optoelectronic semiconductor components configured to emit blue light. In the region marked with G there are only optoelectronic semiconductor components which are configured to emit green light. In the region marked with R there are only optoelectronic semiconductor components which are configured to emit red light. Thus, for example, a display or other display device can be advantageously realized.

Figure 5C:
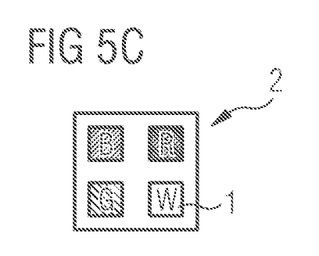

FIG. 5C shows a schematic top view of an arrangement 2 described herein according to the third exemplary embodiment. The arrangement 2 comprises a plurality of optoelectronic semiconductor components 1, each of which is configured to emit electromagnetic radiation of a different color. These are optoelectronic semiconductor components 1 configured to emit red R, green G, blue B, and white W light. Such an RGBW group can, for example, help to create a better white impression for an observer.

Figure 6:
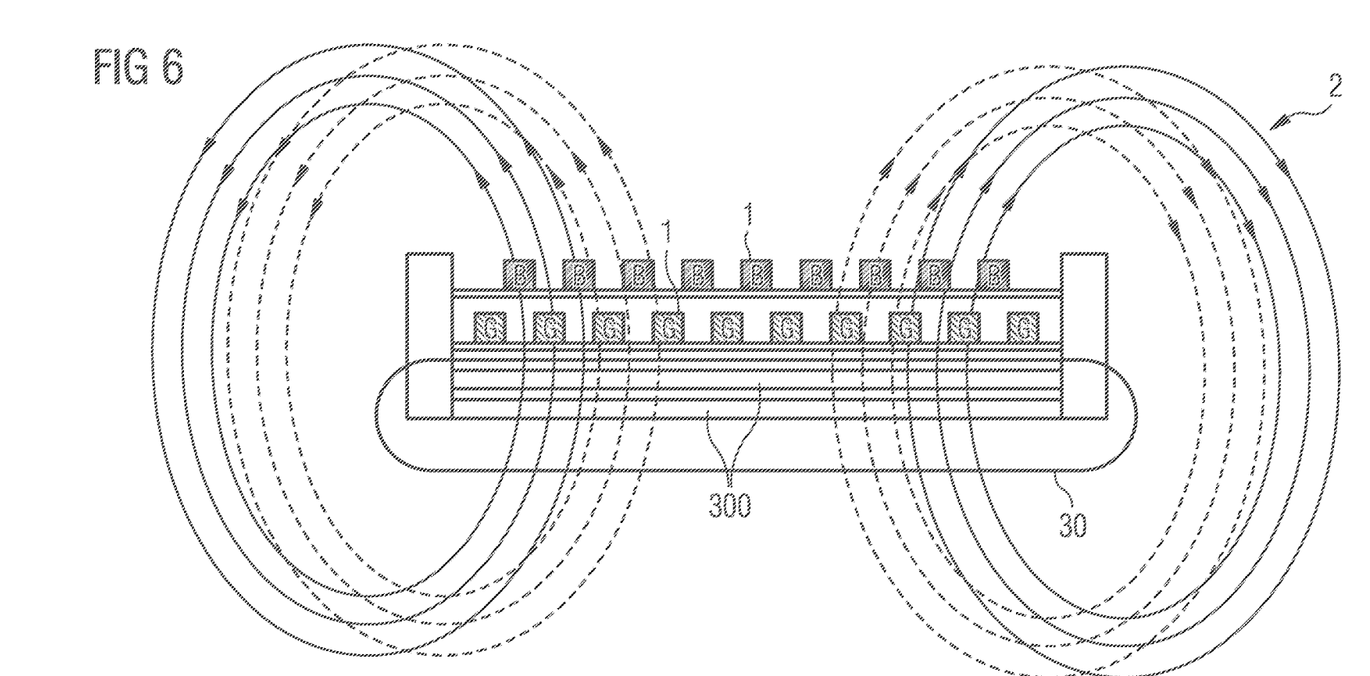

FIG. 6 shows a schematic cross-section of an arrangement 2 described herein according to the fourth exemplary embodiment. The arrangement 2 comprises a plurality of optoelectronic semiconductor components 1 arranged in two layers on top of each other and a transmitter device 30. In each of the layers of optoelectronic semiconductor components 1 shown, a group of optoelectronic semiconductor components 1 is configured to emit electromagnetic radiation of the same color. The first group of optoelectronic semiconductor components 1 corresponds to the layer of optoelectronic semiconductor components 1 facing away from the transmitter device 30. The first group is configured to emit blue B light, while the underlying layer of optoelectronic semiconductor components 1 of the second group is configured to emit green G light. The optoelectronic semiconductor components 1, of the first group comprise a same receiver frequency. The optoelectronic semiconductor components 1, of the second group comprise a same receiver frequency. The receiver frequency of the optoelectronic semiconductor components 1 of the first group is different from the receiver frequency of the optoelectronic semiconductor components 1 of the second group. The transmitter device 30 comprises two transmitter elements 300, each of the transmitter elements 300 being tuned to the receiver frequency of one of the groups of optoelectronic semiconductor components 1. Thus, individual control of the layers of optoelectronic semiconductor components 1 can be advantageously achieved by means of the two transmitter elements 300. By controlling the brightness of the first and the second group of optoelectronic semiconductor components 1, advantageously a mixed color of the generated electromagnetic radiation can be selected, which is between the color locations of the green G and the blue B emitting optoelectronic semiconductor components 1.

Figure 7:
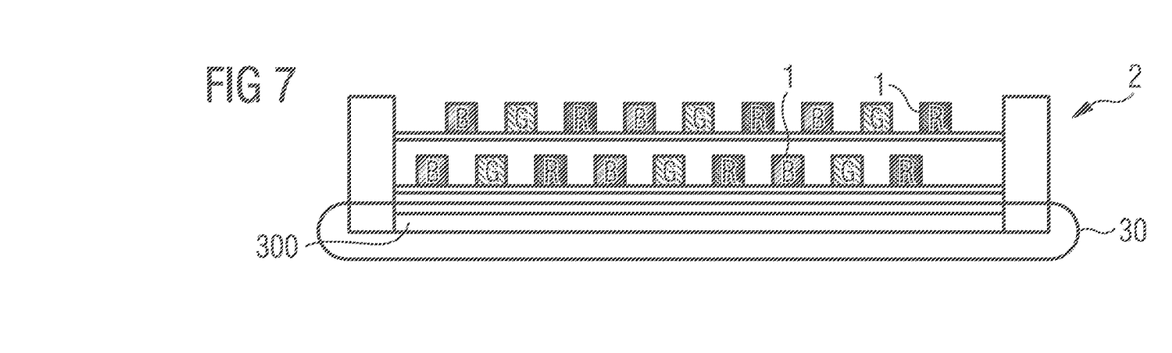

FIG. 7 shows a schematic cross-section of an arrangement 2 described herein according to the fifth exemplary embodiment. The arrangement 2 comprises two layers of optoelectronic semiconductor components 1 configured to emit electromagnetic radiation of different colors. The layers are arranged one above the other. Further, the arrangement 2 comprises a transmitter device 30 comprising a transmitter element 300. The arrangement 2 comprises three different groups of optoelectronic semiconductor components. A first group of optoelectronic semiconductor components 1 is configured to emit blue B light. A second group of optoelectronic semiconductor components 1 is configured to emit green G light. A third group of optoelectronic semiconductor components 1 is configured to emit red R light. The optoelectronic semiconductor components 1 of each group comprise a common receiver frequency. The receiver frequencies of the different groups are different from each other. The transmitter device 30 is configured to generate an alternating electromagnetic field having different transmission frequencies corresponding to the receiver frequencies of the groups of optoelectronic semiconductor components 1.

The transmitter device 30 generates alternating electromagnetic fields of different frequencies sequentially. In other words, alternating electromagnetic fields of different frequencies are generated sequentially in a time sequence, each of which corresponds to the receiver frequencies of the optoelectronic semiconductor components 1. Thus, each group of optoelectronic semiconductor components 1 of a particular color can be individually driven by means of the transmitter device 30 and the one transmitter element 300. The arrangement 2 can emit any mixed color located on a chromaticity scale within an area spanned by the color locations of each group of optoelectronic semiconductor components 1.

The invention is not limited by the description based on the exemplary embodiments. Rather, the invention encompasses any new feature as well as any combination of features, which particularly includes any combination of features in the patent claims, even if that feature or combination itself is not explicitly specified in the patent claims or exemplary embodiments.

LIST OF REFERENCE SIGNS 1 optoelectronic semiconductor component
2 arrangement 10 semiconductor body
100 active region
20 receiving element
200 coil
210 via
30 transmitter device
300 transmitter element
40 insulation layer
50 carrier
80 molding compound
A main emission surface
D distance of the receiving elements
E distance of the transmitter device from the receiving elements
R Radius of the transmitter element
S Radius of the coil
S1 first layer
S2 second layer
S3 third layer

The invention claimed is:

1. An arrangement comprising,
at least two optoelectronic semiconductor components, wherein each of the at least two optoelectronic semiconductor components comprises:
a semiconductor body having a main emission surface and an active region arranged to emit electromagnetic radiation,
a receiving element arranged on a side of the semiconductor body facing away from the main emission surface, and
a radiation-transmissive molding compound, wherein the radiation-transmissive molding compound completely surrounds the semiconductor body and the receiving element,
a receiver frequency is assigned to the receiving element,
the receiving element is configured to extract energy for operating the active region from an alternating electromagnetic field,
at least one transmitter device, wherein
the transmitter device comprises at least one transmitter element and is configured to generate an alternating electromagnetic field,
the optoelectronic semiconductor components are arranged in a plurality of layers one above the other, and
optoelectronic semiconductor components whose distance to the transmitter device is smaller than the distance of optoelectronic semiconductor components from layers arranged above it are operated at a frequency that comprises a correspondingly larger distance from their receiver frequency.

2. The arrangement according to claim 1, wherein the transmitter device comprises a plurality of transmitter elements each tuned to a receiver frequency of one or more receiving elements.

3. The arrangement according to claim 2, wherein each receiving element is assigned exactly one transmitter element that is tuned to the receiver frequency of the receiving element assigned to it.

4. The arrangement according to claim 1, wherein the transmitter device comprises a single transmitter element and is configured to sequentially generate alternating electromagnetic fields of different transmission frequencies, each of which is tuned to the receiver frequencies of the receiving elements.

5. The arrangement according to claim 1, in which the optoelectronic semiconductor components whose receiving elements comprise different receiver frequencies are configured to emit electromagnetic radiation having a different color.

6. The arrangement according to claim 5, wherein
each layer comprises exclusively optoelectronic semiconductor components configured to emit electromagnetic radiation of the same color, and
the optoelectronic semiconductor components in different layers are configured for the emission of electromagnetic radiation of different colors.

7. The arrangement according to claim 5, wherein the optoelectronic semiconductor components are arranged in a common plane, and are placed in groups in the plane, wherein the optoelectronic semiconductor components of one group are configured to emit light of different color in pairs.

8. The arrangement according to claim 1, in which the optoelectronic semiconductor components are irregularly arranged in a plane.

* * * * *